United States Patent [19]
Oguro

[11] Patent Number: 5,714,415
[45] Date of Patent: Feb. 3, 1998

[54] METHOD OF FORMING THIN SEMICONDUCTOR FILM

[75] Inventor: Shizuo Oguro, Tokyo, Japan

[73] Assignee: NEC Corporation, Japan

[21] Appl. No.: 592,991

[22] Filed: Jan. 29, 1996

[30] Foreign Application Priority Data

Feb. 1, 1995 [JP] Japan .................. 7-014839

[51] Int. Cl.$^6$ ............................ H01L 21/20
[52] U.S. Cl. .............. 438/486; 438/482; 438/488
[58] Field of Search ................. 437/101, 233, 437/60, 919, 972; 257/300, 309; 438/482, 486, 505, 508, 509, 488, 680, 684

[56] References Cited

U.S. PATENT DOCUMENTS

| | | | |
|---|---|---|---|
| 5,198,387 | 3/1993 | Tang | 437/101 |
| 5,227,329 | 7/1993 | Kobayashi et al. | 437/101 |
| 5,242,855 | 9/1993 | Oguro | 437/109 |
| 5,366,917 | 11/1994 | Watanabe et al. | 437/60 |
| 5,371,039 | 12/1994 | Oguro | 437/101 |
| 5,418,180 | 5/1995 | Brown | 437/60 |
| 5,464,795 | 11/1995 | Oguro | 437/101 |
| 5,532,183 | 7/1996 | Sugawara | 437/101 |

FOREIGN PATENT DOCUMENTS

| | | | |
|---|---|---|---|
| 63-137411 | 6/1988 | Japan | H01L 21 |
| 6314661 | 11/1994 | Japan | H01L 21 |
| 2199987(A) | 7/1980 | WIPO | 437/23.3 |

OTHER PUBLICATIONS

"Silicon Processing For VLSI ERA", vol. I, Process Technology, Wolf et al., pp. 169–171.

Kobayashi et al; "Novel Highly Conductive Polycrystalline Silicon Films Reducing Processing Temperature Down to 650° C."; 1988; pp. 57–60; Conference on Solid State Devices and Materials, Tokyo.

*Primary Examiner*—John Niebling
*Assistant Examiner*—S. Mulpuri
*Attorney, Agent, or Firm*—Hayes, Soloway, Hennessey, Grossman & Hage, P.C.

[57] ABSTRACT

A method of forming a thin semiconductor film including an impurity for obtaining a conductivity includes the step of depositing a thin amorphous silicon film by chemical vapor deposition using silane as a deposition source gas at a deposition rate of at least 3 nm/minute while introducing the impurity, and the step of crystallizing the deposited thin amorphous silicon film by annealing.

8 Claims, 8 Drawing Sheets

FIG. IA
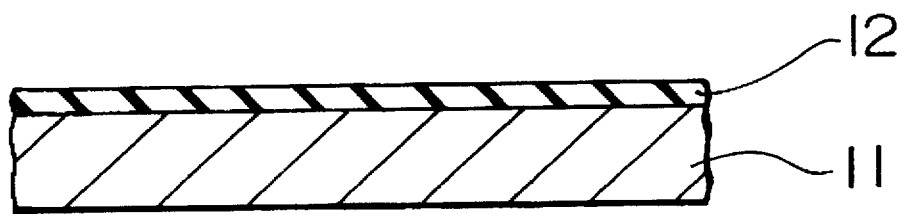
FIG. IB
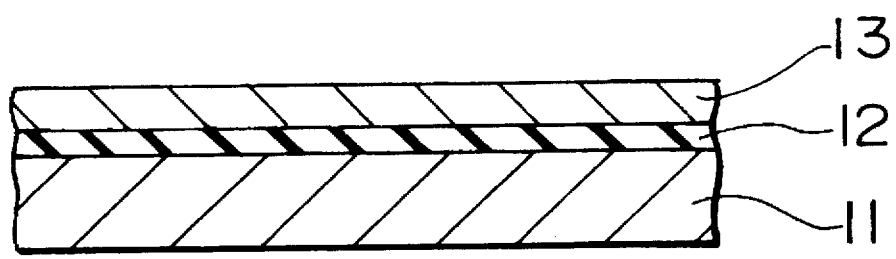
FIG. IC
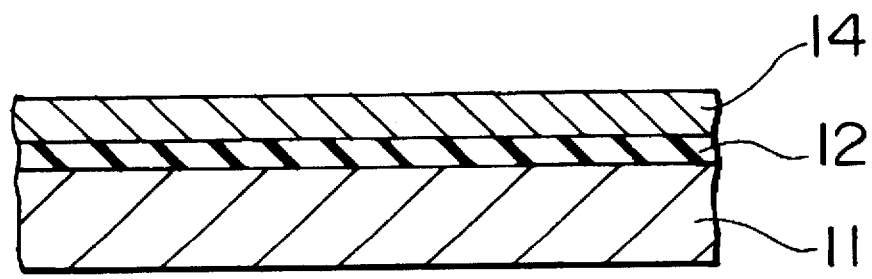

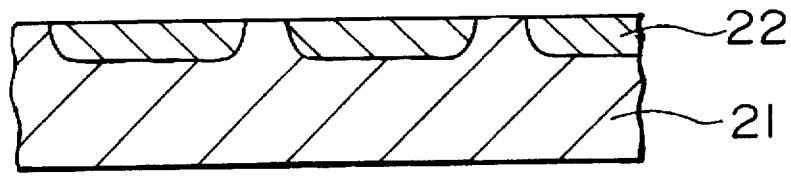
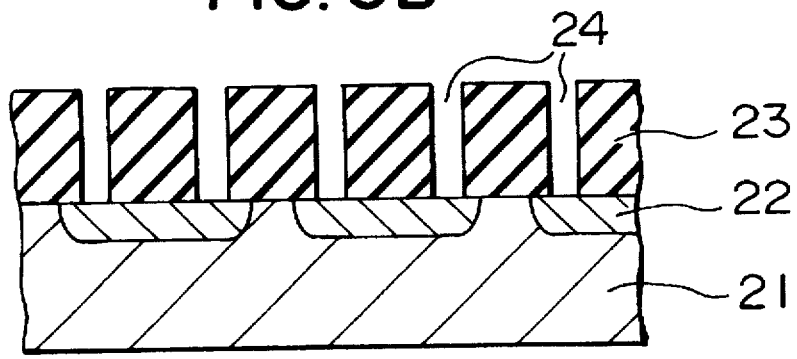
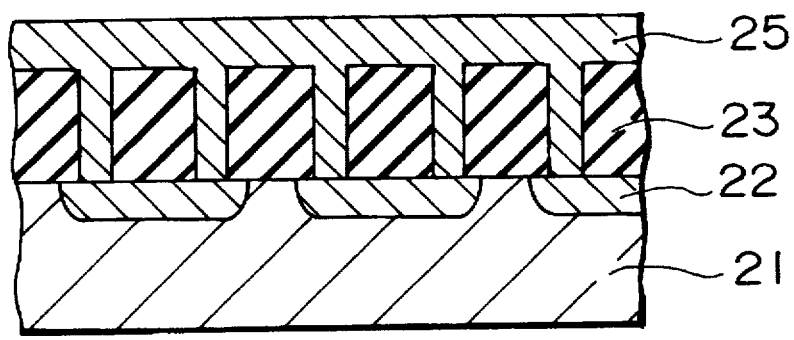
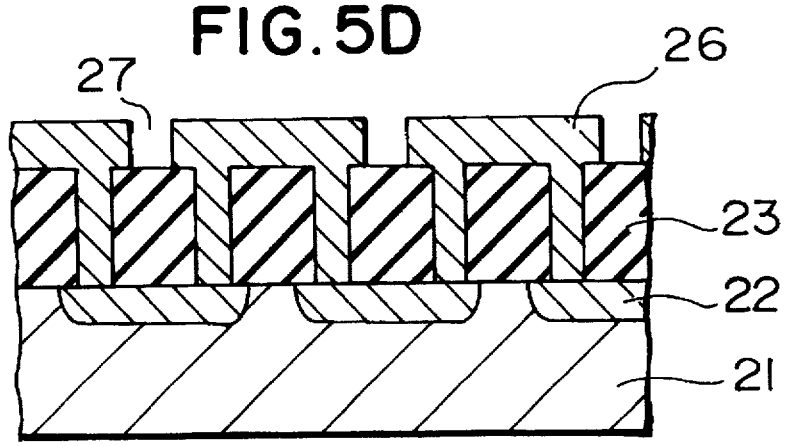

FIG. 7

| | 3RD EMBODIMENT | PRIOR ART |
|---|---|---|
| $C/C_0$ | 0.98 | 0.91 |

METHOD OF FORMING THIN SEMICONDUCTOR FILM

BACKGROUND OF THE INVENTION

1. Field of the Invention

The present invention relates to a method of forming a thin semiconductor film and, more particularly, to a method of forming a thin polysilicon film with a low resistivity, which is used for various semiconductor devices.

2. Description of the Prior Art

Thin polysilicon films have significant roles as various electrodes, wiring materials, or resistors for forming semiconductor devices. For example, thin polysilicon films are applied as capacitor electrodes or gate electrodes in memory devices, or materials for burying contacts between active layers and wiring layers in devices.

In recent years, polysilicon thin film transistors (TFT; Thin Film Transistor) using a thin polysilicon film itself as an active layer in a device have been developed, which are put in practice as load elements of static RAMs (SRAM) or liquid crystal driving elements for liquid crystal display devices (LCD; Liquid Crystal Display).

Conventionally, to form such thin polysilicon films, chemical vapor deposition (CVD) using a silane-based gas (silane ($SiH_4$) or disilane ($Si_2H_6$)) as a deposition gas is used to directly deposit a thin polysilicon film at a deposition temperature of about 650° C.

Alternatively, a technique is used in which a thin amorphous silicon (a-Si) film is deposited first at a low temperature of about 500° C., and thereafter, annealing (crystallization) is performed while the sample temperature is held at a temperature of 600° C. to 900° C., thereby obtaining a thin polysilicon film.

The latter technique is reported in "Novel Highly Conductive Polycrystalline Silicon Films Reducing Processing Temperature Down to 650° C." (T. Kobayashi, S. Iijima, S. Aoki, and A. Hiraiwa., Abstracts of the 20th Conference on Solid State Devices and Materials, 1988, pp. 57–60).

Particularly, a thin polysilicon film formed by the latter technique has a large average crystal grain size, and therefore, has advantages such as capability of lowering resistivity and a few crystal grain boundaries which largely influence the transistor characteristics, as compared to a thin polysilicon film formed by the former technique. For this reason, the latter technique has currently received a great deal of attention and been extensively developed as an application to TFTs, or various methods of forming electrodes in the future.

The conventional method of forming a thin polysilicon film by crystallizing an amorphous silicon film will be described below with reference to a detailed example. After a thermal oxide film having a thickness of 100 nm is grown on a single-crystal silicon substrate, a conventional LPCVD (Low Pressure Chemical Vapor Deposition) furnace is used to deposit a thin amorphous silicon film having a thickness of 150 nm, thereby completing an amorphous silicon substrate. As deposition conditions, the pressure is 0.15 Torr, the temperature is 470° C., the deposition gas is 100%-$Si_2H_6$, the deposition gas flow rate is 96 sccm, and the He-based 4%-$PH_3$ gas flow rate is 120 sccm.

Subsequently, using an electric furnace, the thin amorphous silicon film is annealed in, a nitrogen atmosphere for 30 minutes while holding the internal temperature of the furnace at 850° C., and crystallized, thereby obtaining a thin polysilicon film. When an amorphous silicon film is deposited at a ratio of phosphorus (P) atoms to silicon (Si) atoms (P/Si=$2.5\times10^{-2}$) in the reaction gas obtained from the $PH_3$ gas flow rate and the $Si_2H_6$ gas flow rate at this time, the P concentration in the crystallized film is about $3\times10^{20}$ $cm^{-3}$.

In the conventional polysilicon film having a thickness of 100 nm or more, when P is present in the film at such a high concentration, the resistivity is sufficiently as low as about $6\times10^{-6}$ $\Omega\cdot m$.

However, when a polysilicon film is made thinner at the above ratio of P atoms to Si atoms in the reaction gas, the resistivity abruptly increases near a thickness of 50 nm. To solve this problem, a technique is proposed in Japanese Unexamined Patent Publication No. 6-314661 in which the ratio of P atoms to Si atoms in the reaction gas is set to 0.05 to 0.2, thereby obtaining a thin polysilicon film having a thickness of 50 nm or less.

According to this technique, after a thermal oxide film having a thickness of 100 nm is grown on a single-crystal silicon substrate, a conventional LPCVD furnace is used to deposit a thin amorphous silicon film having a thickness of 50 nm, thereby completing an amorphous silicon substrate. As deposition conditions, the temperature is 470° C., the pressure is 20 Pa, the deposition gas is 100%-$Si_2H_6$, the deposition gas flow rate is 96 sccm, and the He-diluted 4%-$PH_3$ (4%-$PH_3$/He) gas flow rate is 240 sccm.

Subsequently, using an electric furnace, the thin amorphous silicon film is annealed in, e.g., a nitrogen atmosphere for 30 minutes while holding the internal temperature of the furnace at 850° C. and crystallized, thereby obtaining a thin polysilicon film. The P concentration in the resultant polysilicon film is about $6\times10^{20}$ $cm^{-3}$, and the resistivity is about $8.0\times10^{-6}$ $\Omega\cdot m$.

When the deposition temperature is 510° C., the pressure is 17 Pa, the 100%-$Si_2H_6$ gas flow rate is 96 sccm, and the He-diluted 4%-$PH_3$ gas flow rate is 200 sccm, the P concentration in the polysilicon film is about $5\times10^{20}$ $cm^{-3}$, and the resistivity is further lowered to about $6.5\times10^{-6}$ $\Omega\cdot m$.

However, when $Si_2H_6$ is used as a deposition gas, as in the above example, thickness uniformity and step coverage deteriorate thereby making it difficult to apply the polysilicon film to fine contact plugs of highly integrated devices or the like. In addition, because of its high reactivity, $Si_2H_6$ has a high risk of explosion.

A technique disclosed in Japanese Unexamined Patent Publication No. 63-137411 uses $SiH_4$ as a deposition gas. More specifically, a $PH_3$ gas and an $SiH_4$ gas are used in an LPCVD furnace to form an amorphous silicon film at 600° C. or less, and thereafter, the amorphous silicon film is crystallized at a temperature of 700° C. or more. In this prior art, boron (B) doped using $B_2H_6$ in place of $PH_3$ is also described. The above-mentioned Japanese Unexamined Patent Publication No. 6-314661 also suggests that $SiH_4$ may be used in place of $Si_2H_6$.

When $SiH_4$ is used as a deposition gas in place of $Si_2H_6$, thickness uniformity and step coverage are improved so that the polysilicon film can be applied to fine contact plugs of highly integrated devices or the like. In addition, since reactivity is low, risk of explosion decreases. From these points, $SiH_4$ is more advantageous as a deposition gas for a thin polysilicon film usable as an electrode material for highly integrated devices in the future.

However, in deposition using $SiH_4$, even when the P concentration in the film is increased, the resistivity cannot be made lower than that in deposition using $Si_2H_6$.

Particularly, when the thickness of the polysilicon film is 50 nm or less, this phenomenon becomes conspicuous. As shown in FIG. 2, the resistivity becomes as high as about $1.15 \times 10^{-5}$ Ω·m even at a high P concentration of $9 \times 10^{20}$ cm$^{-3}$ (prior art A). To the contrary, in deposition using Si$_2$H$_6$, the resistivity is as low as about $0.7 \times 10^{-5}$ Ω·m at a P concentration of at least $5 \times 10^{20}$ cm$^{-3}$ and almost constant (prior art B).

Thin polysilicon films usable as an electrode material for highly integrated devices are required to be applied in very small regions as integration of semiconductor devices progresses. For example, polysilicon films are often formed thinner and applied to bury a contact hole with a diameter of 0.2 μm or less or to bury a region smaller than 0.1 μm in formation of a complex three-dimensional capacitor. In the above thin film formation, polysilicon with a sufficiently low resistivity is demanded.

When an Si H$_4$ gas is used as a deposition gas, another problem is posed in the relationship between the deposition rate and the resistivity. More specifically, when SiH$_4$ is used as a deposition gas, the grain size changes in accordance with the deposition rate, and the change in grain size largely influences the resistivity. For example, when deposition is performed by the technique disclosed in Japanese Unexamined Patent Publication No. 6-314661 using SiH$_4$ as a deposition gas, the deposition rate is about 1 nm/minute, and the resistivity is relatively as high e.g. $1.25 \times 10^{-5}$ Ω·m. The P concentration in the film is $8 \times 10^2$ cm$^{-3}$.

In other words, the technique disclosed in Japanese Unexamined Patent Publication No. 6-314661 has as its main object to increase the impurity concentration in a thin semiconductor film, and the ratio of impurity atoms to silicon atoms in a reaction gas has been studied. Therefore, this prior art does not consider the relationship between the deposition rate and the resistivity at all.

As in the prior art described first, a film formed in deposition using Si$_2$H$_6$ is not suitable to bury a small region because of its poor step coverage. Therefore, it is strongly desired to form a thin polysilicon film with a sufficiently low resistivity by using an SiH$_4$ gas as a deposition gas with satisfactory step coverage.

SUMMARY OF THE INVENTION

The present invention has been made in consideration of the above situation, and has as its object to provide a method of forming a thin semiconductor film, in which a thin polysilicon film with a sufficiently low resistivity can be formed using an SiH$_4$ gas as a deposition gas at a relatively high deposition rate.

In order to achieve the above object, according to the basic aspect of the present invention, there is provided a method of forming a thin semiconductor film containing an impurity for obtaining a conductivity, comprising the step of depositing a thin amorphous silicon film by chemical vapor deposition using silane as a deposition source gas at a deposition rate of at least 3 nm/minute while introducing the impurity, and the step of crystallizing the deposited thin amorphous silicon film by annealing.

The present invention also has the following subsidiary aspects.

In the step of depositing the thin amorphous silicon film according to the basic aspect, the deposition pressure is 100 to 500 Pa, the deposition rate is at least 3 nm/minute, the deposition temperature is 530° C. to 570° C., and the impurity concentration in the thin amorphous silicon film is $3 \times 10^{20}$ to $20 \times 10^{20}$ cm$^{-3}$.

In addition, as a gas for doping the impurity, any one of phosphine and tertiary butyl phosphine, any one of arsine, arsenic trichloride, and tertiary butyl arsine, or diborane is used in deposition of the thin amorphous silicon film.

Furthermore, in step of crystallizing the thin amorphous silicon film according to the basic aspect, crystallization is performed at an annealing temperature of 580° C. to 950° C.

As described above, according to the present invention, a thin amorphous silicon film is deposited by CVD while introducing an impurity, and thereafter crystallized by annealing to form a thin semiconductor film. In these processes, the thin amorphous silicon film 13 is deposited using an SiH$_4$ gas at a deposition rate of 3 nm/minute or more and crystallized by annealing.

With these processes, a thin polysilicon film with a resistivity as low as that in deposition using an Si$_2$H$_6$ gas can be formed. In addition, since thickness uniformity and step coverage are improved as compared to deposition using Si$_2$H$_6$, the thin polysilicon film can be effectively used as an electrode material for highly integrated devices with a fine structure. In this case, the resistivity of the electrode material can be lowered. Therefore, the operation speed of the highly integrated devices can be largely increased.

The above and many other advantages, features and additional objects of the present invention will become manifest to those versed in the art upon making reference to the following detailed description and accompanying drawings in which preferred structural embodiments incorporating the principles of the present invention are shown by way of illustrative example.

BRIEF DESCRIPTION OF THE DRAWINGS

FIGS. 1A to 1C are sectional views showing steps in manufacturing a semiconductor chip according to the first embodiment of the present invention;

FIGS. 5A to 5D are sectional views showing steps in manufacturing a semiconductor chip according to the second embodiment of the present invention;

FIG. 7 is a table showing the ratio of a capacitance value C obtained when a voltage of +3 V is applied to the lower electrode of a capacitor electrode of a memory device formed according to the third embodiment of the present invention, to a capacitance value $C_O$ near the zero bias.

DETAILED DESCRIPTION OF THE PREFERRED EMBODIMENTS

Figure 2:
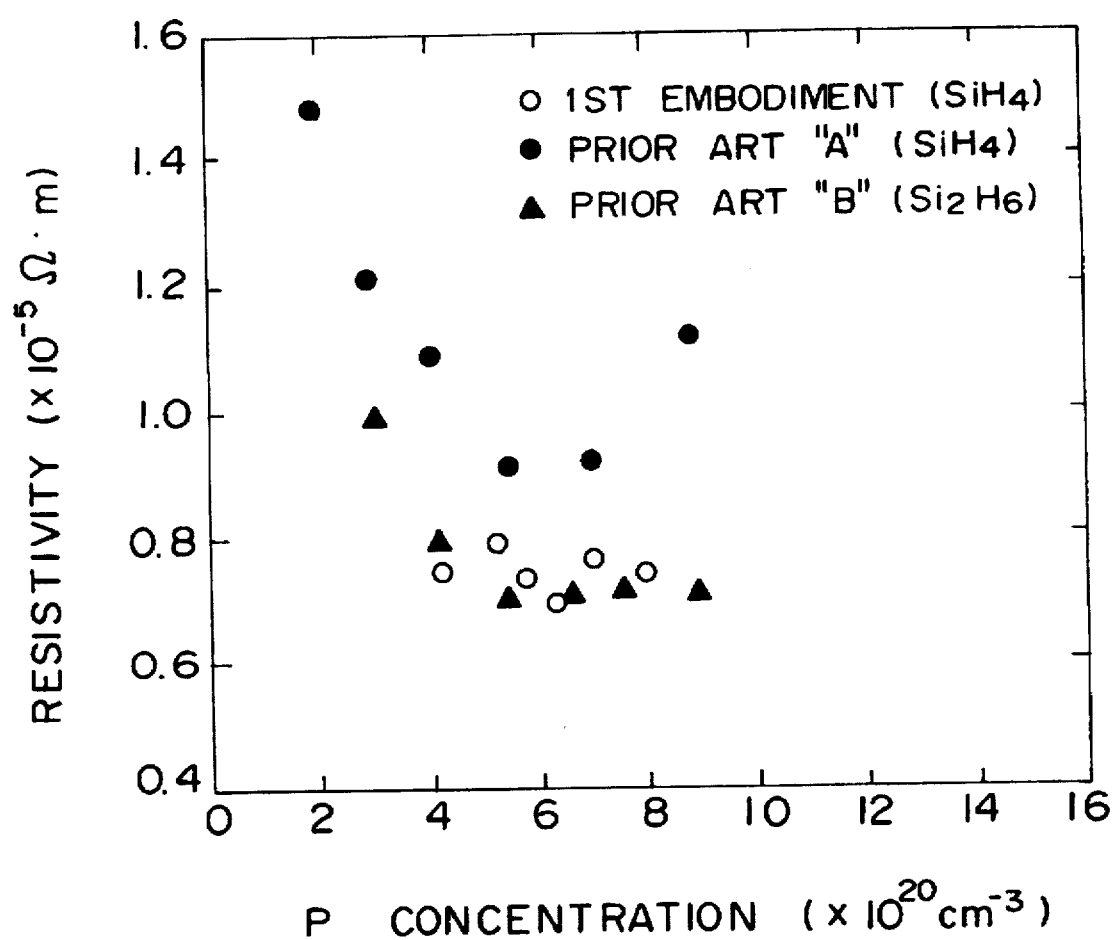
FIG. 2 is a graph showing the relationship between the resistivity and the P concentration in the thin polysilicon film according to the first embodiment of the present invention.

Preferred embodiments of the present invention will be described below with reference to the accompanying drawings.

FIGS. 1A to 1C are sectional views showing steps in manufacturing a semiconductor chip according to the first embodiment of the present invention. A method of forming a thin polysilicon film according to the first embodiment of the present invention will be described below with reference to FIGS. 1A to 1C.

First, a silicon oxide film 12 having a thickness of 100 nm is formed on a p-type silicon substrate 11 having a plane orientation of (100) and a resistivity of $1 \times 10^{-2}$ Ω·m by thermal oxidation [FIG. 1A].

Subsequently, using a conventional electric resistance heating LPCVD apparatus, a plurality of thin phosphorus (P)-doped amorphous silicon (a-Si) films 13 each having a thickness of 50 nm are deposited on the silicon oxide film 12 [FIG. 1B].

As deposition conditions, the temperature in the reaction tube is 550° C., the pressure is 100 to 300 Pa, a 100%-SiH$_4$ gas is used as a deposition gas, and an He-based 4%-diluted PH$_3$ (4%-PH$_3$/He) gas is used as a doping gas. The pressure and gas flow rates are set such that the deposition rate becomes 3 nm/minute or more, and the phosphorus concentration in the film becomes $3 \times 10^{20}$ cm$^{-3}$ or more.

For example, by setting the pressure to 140 Pa, and the flow rates of the 100%-SiH$_4$ gas and the 4%-PH$_3$/He Gas to 720 sccm and 45 sccm, respectively, the deposition rate becomes 3.5 nm/minute, and the phosphorus concentration in the film becomes $5 \times 10^{20}$ cm$^{-3}$.

Thereafter, the thin phosphorus-doped amorphous silicon films 13 are annealed in a nitrogen atmosphere for 30 minutes while holding 850° C. and crystallized, thereby forming a thin polysilicon film 14 [FIG. 1C].

Figure 3:
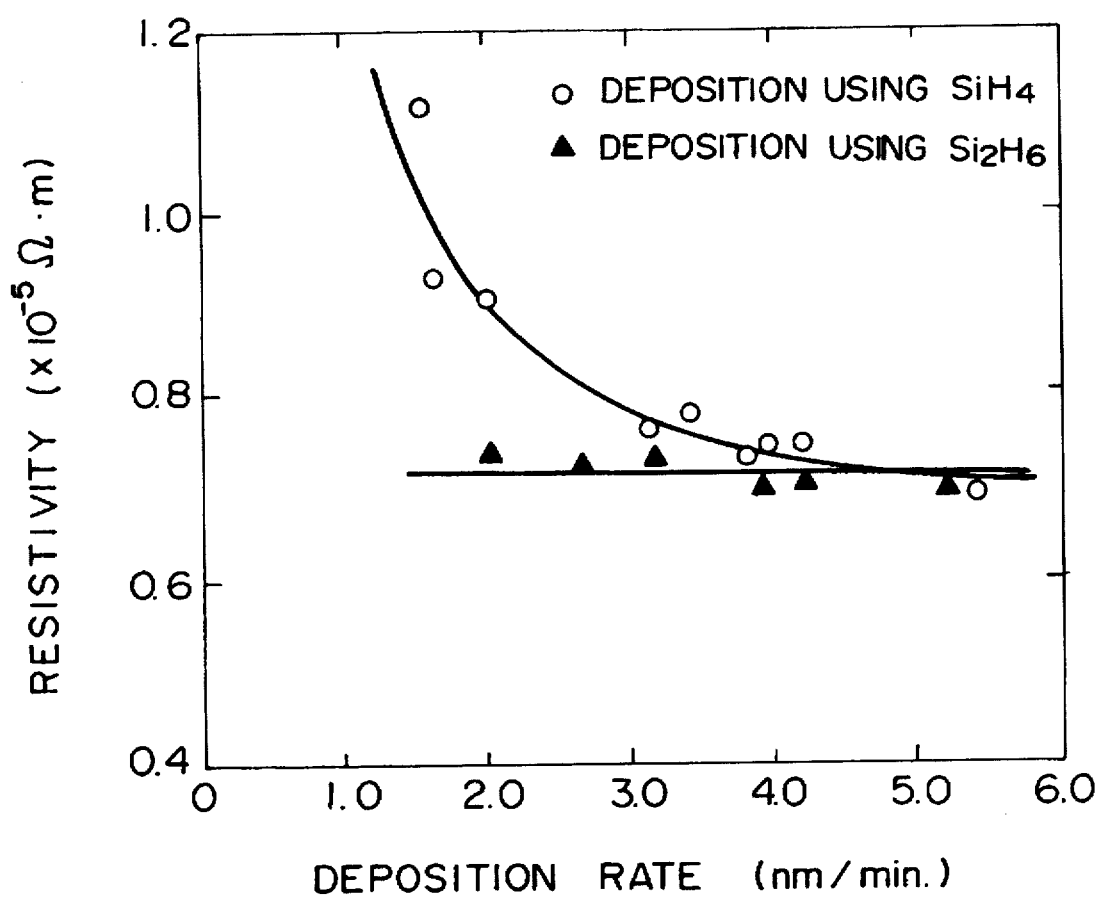
FIG. 3 is a graph showing the relationship between the resistivity and the deposition rate in formation of the thin polysilicon film according to the first embodiment of the present invention.
Figure 4:
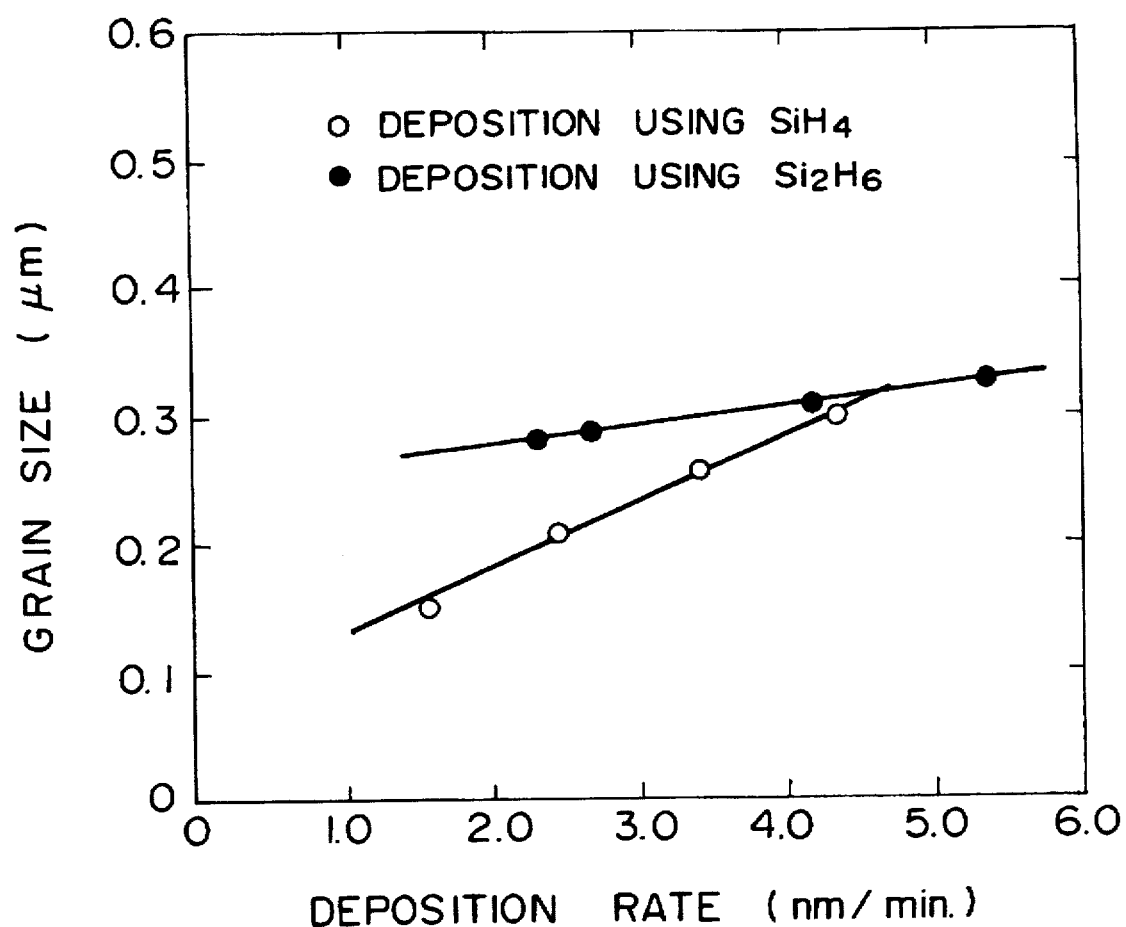
FIG. 4 is a graph showing the relationship between the grain size and the deposition rate in formation of the thin polysilicon film according to the first embodiment of the present invention.

FIG. 2 is a graph showing the relationship between the resistivity and the phosphorus concentration in the thin polysilicon film according to the first embodiment of the present invention. FIG. 3 is a graph showing the relationship between the resistivity and the deposition rate in formation of the thin polysilicon film according to the first embodiment of the present invention. FIG. 4 is a graph showing the relationship between the grain size and the deposition rate in formation of the thin polysilicon film according to the first embodiment of the present invention.

FIG. 2 shows the relationship between the resistivity and the phosphorus concentration in the thin polysilicon film. In FIG. 2, the thin polysilicon film obtained by the above processes is the first embodiment, a thin polysilicon film obtained by amorphous deposition using an SiH$_4$ gas at a deposition rate of 3 nm/min or less is prior art A, and a thin polysilicon film obtained by deposition using an Si$_2$H$_6$ gas at a deposition temperature of 550° C. is prior art B.

As shown in FIG. 2, when the phosphorus concentration is $4 \times 10^{20}$ cm$^{-3}$ or more, the resistivity of the first embodiment (indicated by ○) is lower than that of prior art A (indicated by ●) and almost the same as that of prior art B (indicated by ▲).

That is, the resistivity of prior art A as deposition using the SiH$_4$ gas is high and does not decrease even when the phosphorus concentration in the film increases. To the contrary, the resistivity of the first embodiment is as low as in prior art B as deposition using the Si$_2$H$_6$ gas.

As described above, when the deposition rate is set to 3 nm/min or more in deposition using the SiH$_4$ gas, a thin polysilicon film having a low resistivity as that in deposition using the Si$_2$H$_6$ gas can be obtained.

FIG. 3 shows the relationship between the resistivity and the deposition rate of each of deposition using the SiH$_4$ gas and deposition using an Si$_2$H$_6$ gas at a phosphorus concentration of at least $5 \times 10^{20}$ cm$^{-3}$. As shown in FIG. 3, in deposition using the Si$_2$H$_6$ gas (indicated by ▲), the resistivity is almost constant, independent of the deposition rate. To the contrary, in deposition using the SiH$_4$ gas (indicated by ○), the resistivity depends on the deposition rate and decreases with an increase in deposition rate.

FIG. 4 shows the relationship between the grain size and the deposition rate of each of deposition using the SiH$_4$ gas and deposition using the Si$_2$H$_6$ gas. As shown in FIG. 4, in deposition using the SiH$_4$ gas (indicated by ○), when the deposition rate is small, the grain size is smaller than that of deposition using the Si$_2$H$_6$ gas (indicated by ●). However, as the deposition rate increases, the grain size increases to almost the same as that of deposition using the Si$_2$H$_6$ gas.

More specifically, in deposition using the SiH$_4$ gas at a small deposition rate, the atom arrangement in the formed amorphous silicon film becomes relatively close to that of a crystal. Therefore, nucleation of crystal grains frequently occurs in crystallization, so the crystal grains cannot grow.

On the other hand, in deposition using the SiH$_4$ gas, when the deposition rate is increased, an amorphous structure with a more disturbed atom arrangement is obtained. For this reason, the frequency of nucleation of crystal grains is lowered so that the crystal grains can grow.

The reason why the grain size of deposition using the Si$_2$H$_6$ gas does not change in accordance with the deposition rate is that the deposition mechanism differs from that of deposition using the SiH$_4$ gas so that an amorphous film with a sufficiently distorted structure is formed even at a small deposition rate.

As described above, according to the first embodiment of the present invention, in deposition using the SiH$_4$ gas, the resistivity can be lowered as compared to the conventional method of forming a thin polysilicon film. Therefore, a thin polysilicon film with a sufficiently low resistivity can be obtained by deposition using the SiH$_4$ gas.

In the first embodiment of the present invention, only a phosphorus-doped film has been described. However, even when arsenic (As) or boron (B) is used as an impurity for obtaining a conductivity, the same effect as described above can be obtained.

When the impurity is P, tertiary butyl phosphine (TBP) can be used in place of PH$_3$. When the impurity is As, any one of arsine (ASH$_3$), arsenic trichloride (AsCl$_3$), and tertiary butyl arsine (TBA) can be used. When the impurity is B, diborane (B$_2$H$_6$) can be used.

In the first embodiment of the present invention, the deposition temperature is 550° C. However, even when deposition is performed at a temperature of 530° C. to 570° C., the same effect as described above can be obtained. In addition, the annealing temperature in crystallization can be set to 580° C. to 950° C. Furthermore, by changing the annealing time to a time for sufficiently completing crystallization, the same effect as described above can be obtained.

FIGS. 5A to 5D are sectional views showing steps in manufacturing a semiconductor chip according to the second embodiment of the present invention. A method of forming a thin polysilicon film according to the second embodiment of the present invention will be described below with reference to FIGS. 5A to 5D, in which the thin polysilicon film is applied as a material for burying contacts between active layers and wiring layers in various semiconductor devices.

First, As is ion-implanted in the surface of a p-type silicon substrate 21 having a plane orientation of (100) and a resistivity of $1\times10^{-2}$ Ω·m to form n⁺ diffusion layers 22 [FIG. 5A]. Subsequently, a silicon oxide film 23 is formed on the entire surface of the p-type silicon substrate 21 and the n⁺diffusion layers 22, and contact holes 24 each having a diameter of 0.15 μm and a depth of 0.5 μm are formed by photolithography and ion etching [FIG. 5B].

Thereafter, using a conventional electric resistance heating LPCVD apparatus, a thin phosphorus-doped amorphous silicon film 25 having a thickness of 400 nm is deposited on the silicon oxide film 23 [FIG. 5C].

As deposition conditions, 100%-SiH₄ and 4%-PH₃/He gases are used, the temperature in the reaction tube is 550° C., the phosphorus concentration in the film is $5\times10^{20}$ cm⁻³, and the deposition rate is set to 3.5, 4.0, or 5.0 nm/minute.

The thin phosphorus-doped amorphous silicon film 25 is annealed in a nitrogen atmosphere at 850° C. for 30 minutes and crystallized, thereby forming a thin polysilicon film 26. The thin polysilicon film 26 is partially removed by ion etching to form isolation grooves 27, thereby aligning 1,000 polysilicon contact plug portions in a line [FIG. 5D].

In the above processes of manufacturing a contact resistance evaluation substrate, a thin polysilicon film obtained by amorphous deposition at a deposition rate of 2.0 nm/min is acknowledged as prior art of deposition using the SiH₄ gas, and a thin polysilicon film obtained using the Si₂H₆ gas at a deposition temperature of 550° C. is acknowledged as prior art of deposition using the Si₂H₆ gas. A comparison between these prior arts will be described below. Note that the phosphorus concentration in the thin polysilicon films of these prior arts is set to $5\times10^{20}$ cm⁻³.

As for the contact resistance evaluation substrate manufactured with the above processes, the contact resistance was measured. At a deposition rate of 3.5, 4.0, or 5.0 nm/minute, the resistance per contact was 488±20, 480±25, or 472±15 Ω.

As compared to a resistance of 603±40 Ω obtained in the prior art of deposition using the SiH₄ gas, the contact resistance is reduced to about 80%. On the other hand, in the prior art B of deposition using the Si₂H₆ gas, although the resistivity of the thin polysilicon film decreases as shown in FIG. 2, the contact resistance becomes as high as 552±30 Ω because of its poor step coverage.

As described above, by applying the second embodiment of the present invention, a contact with a low resistivity can be formed even when the contact diameter is as small as about 0.15 μm, which can largely contribute to higher integration of semiconductor devices in the future.

In the second embodiment of the present invention, only a phosphorus-doped film has been described. However, even when arsenic (As) or boron (B) is used as an impurity for obtaining a conductivity, the same effect as described above can be obtained.

When the impurity is P, tertiary butyl phosphine (TBP) can be used in place of PH₃. When the impurity is As, any one of arsine (AsH₃), arsenic trichloride (AsCl₃), and tertiary butyl arsine (TBA) can be used. When the impurity is B, diborane (B₂H₆) can be used.

In the second embodiment of the present invention, the phosphorus concentration in the thin polysilicon film is $5\times10^{20}$ cm⁻³. However, within the range of $3\times10^{20}$ to $20\times10^{20}$ cm⁻³, the same effect as described above can be obtained.

In the second embodiment of the present invention, the deposition temperature is 550° C., and the deposition rate is 3.5, 4.0, or 5.0 nm/minute. However, so long as the deposition rate is 3 nm/minute or more, and the deposition temperature is 530° C. to 570° C., the same effect as described above can be obtained. In addition, the annealing temperature in crystallization can be set at any temperature between 580° C. to 950° C., and by changing the annealing time to a time for sufficiently completing crystallization, the same effect as described above can be obtained.

Figure 6A:
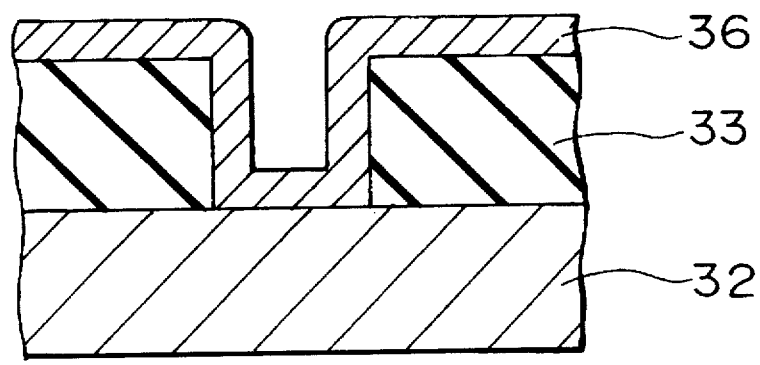
FIGS. 6A to 6C are sectional views showing steps in manufacturing a semiconductor chip according to the third embodiment of the present invention.
Figure 6B:
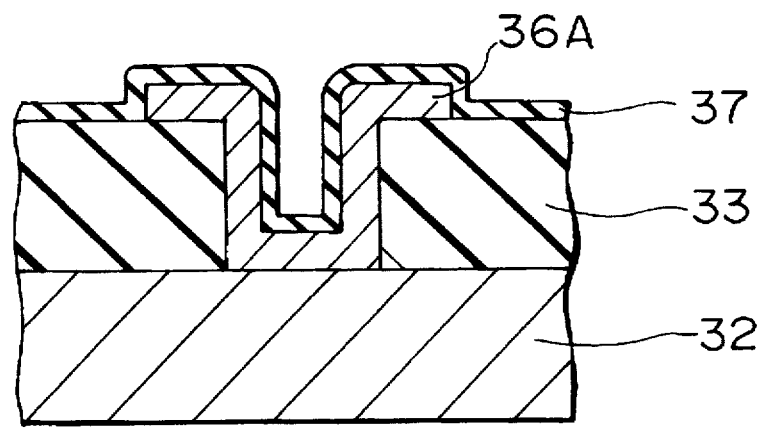
Figure 6C:
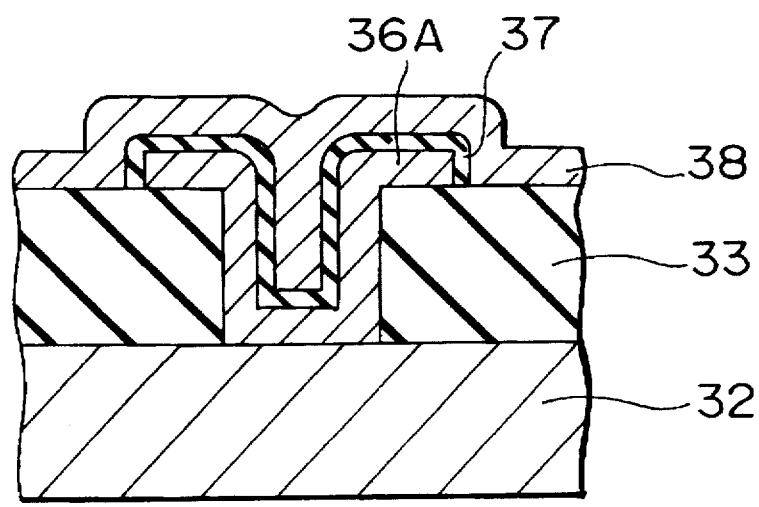

FIGS. 6A to 6C. are sectional views showing steps in manufacturing a semiconductor chip according to the third embodiment of the present invention. A method of forming a thin polysilicon film according to the third embodiment of the present invention will be described below with reference to FIGS. 6A to 6C, in which the thin polysilicon film is applied to the capacitor electrode of a memory device.

First, As is ion-implanted to the surface of a p-type silicon substrate having a plane orientation of (100) and a resistivity of $1\times10^{-2}$ Ω·m to form an n⁺diffusion layer 32. A silicon oxide film 33 having a thickness of 1 μm is formed on the n⁺diffusion layer 32. A groove having a width of 1 μm is formed in the silicon oxide film 33.

In this state, using a conventional electric resistance heating LPCVD apparatus, a thin phosphorus-doped amorphous silicon film having a thickness of 30 nm is deposited on the silicon oxide film 33. As deposition conditions, 100%-SiH₄ and 4%-PH₃/He gases are used, the temperature in the reaction tube is 550° C., the phosphorus concentration in the film is $3\times10^{20}$cm⁻³, and the deposition rate is 3.5 nm/minute.

Subsequently, the thin phosphorus-doped amorphous silicon film is annealed in a nitrogen atmosphere at 850° C. for 30 minutes and crystallized, thereby forming a thin polysilicon film 36 [FIG. 6A].

The thin polysilicon film 36 is patterned so as to form a lower electrode 36A, and thereafter, a capacitor insulating film 37 is formed to a thickness of 5 nm [FIG. 6B]. In addition, a thin phosphorus-doped amorphous silicon film serving as an upper electrode 38 is deposited to a thickness of 150 nm under the same deposition conditions as for the lower electrode 36A. The thin phosphorus-doped amorphous silicon film is annealed in a nitrogen atmosphere at 850° C. for 30 minutes and crystallized, thereby forming a thin polysilicon film [FIG. 6C].

In the above processes for manufacturing the capacitor electrode of a memory device, electrodes formed under conditions such as a deposition rate of 2.0 nm/minute at a phosphorus concentration of $3\times10^{20}$ cm⁻³ and annealed in a nitrogen atmosphere at 850° C. for 30 minutes are used as lower and upper electrodes of a prior art.

Figure 7:
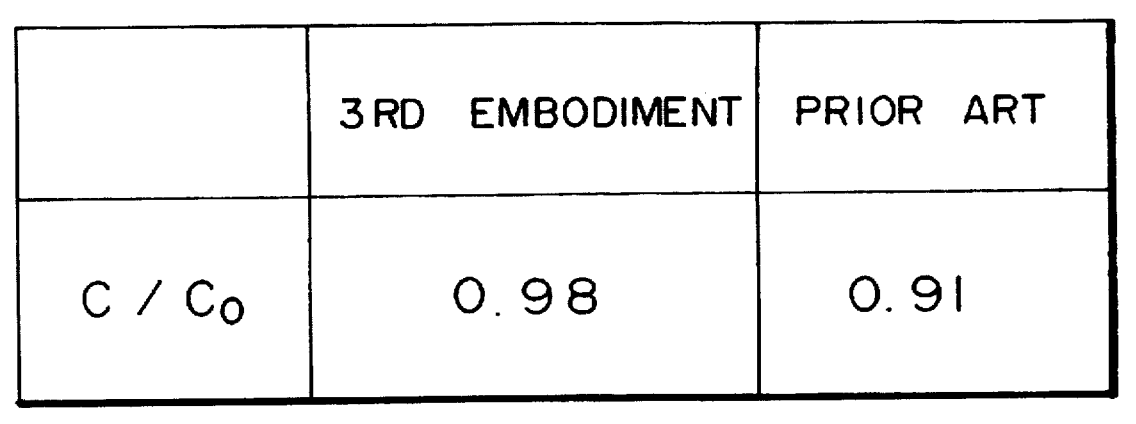

FIG. 7 is a table showing the measurement results of the characteristics of capacitors formed in the above processes. FIG. 7 shows a ratio (C/C₀) of a capacitance value C obtained when a voltage of +3 V is applied to the lower electrode to a capacitance value C₀ near the zero bias, which ratio depends on high-frequency C-V characteristics.

More specifically, the ratio (C/C₀) in the third embodiment of the present invention is 0.98 while that in the prior art is 0.91. Therefore, when the third embodiment of the present invention is applied, depletion of carriers in the electrode is hardly observed, and a stable capacitance can be obtained in a large bias region, so that an electrode superior to that of the prior art can be obtained.

Figure 8A:
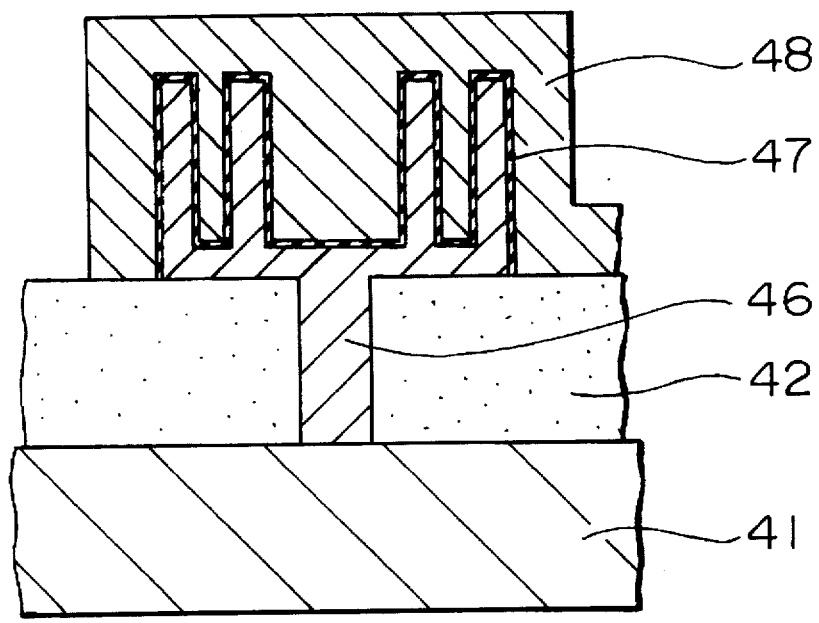
FIGS. 8A and 8B are sectional views showing a multi-cylinder type capacitor structure and a multilayered fin type capacitor structure according to the present invention, respectively.
Figure 8B:
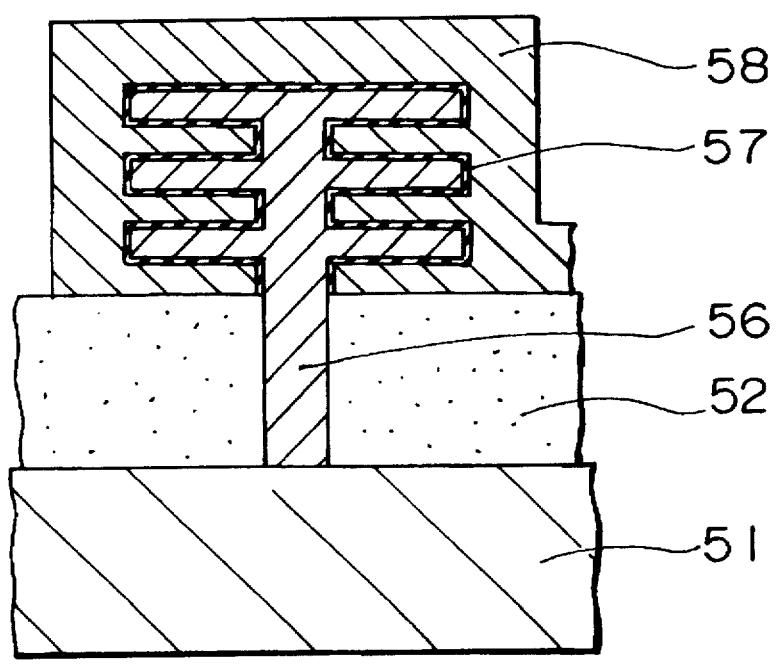

In the third embodiment of the present invention, a simple capacitor structure is shown. However, the capacitor structure can be complicated as in a multicylinder structure shown in FIG. 8A or as in a multilayered fin structure shown in FIG. 8B. In such a structure, a lower electrode 46 or 56 having a complex shape is formed on an interlayer 42 or 52 on a silicon substrate 41 or 51.

A capacitor insulating film 47 or 57 is formed on the surface of the lower electrode 46 or 56, and an upper electrode 48 or 58 is formed on the resultant structure. Even such a complex shape can sufficiently cope with a thin capacitor electrode by applying the third embodiment of the present invention, so that satisfactory capacitance characteristics can be obtained.

In the third embodiment of the present invention, only a phosphorus-doped film has been described. However, even when arsenic (As) or boron (B) is used as an impurity for obtaining a conductivity, the same effect as described above can be obtained.

When the impurity is P, tertiary butyl phosphine (TBP) can be used in place of $PH_3$. When the impurity is As, any one of arsine ($ASH_3$), arsenic trichloride ($AsCl_3$), and tertiary butyl arsine (TBA) can be used. When the impurity is B, diborane ($B_2H_6$) can be used.

In the third embodiment of the present invention, the phosphorus concentration in the thin polysilicon film is $3 \times 10^{20}$ $cm^{-3}$. However, within the range of $3 \times 10^{20}$ to $20 \times 10^{20}$ $cm^{-3}$, the same effect as described above can be obtained.

In the third embodiment of the present invention, the deposition temperature is 550° C., and the deposition rate is 3.5 nm/minute. However, as far as the deposition rate is 3 nm/minute or more, and the deposition temperature is 530° C. to 570° C., the same effect as described above can be obtained. In addition, the annealing temperature during crystallization can be set at any temperature between 580° C. to 950° C., and by changing the annealing time to a time for sufficiently completing crystallization, the same effect as described above can be obtained.

In this manner, a thin amorphous silicon film is formed by CVD while introducing an impurity, and thereafter crystallized by annealing to form a thin semiconductor film. In these processes, the thin amorphous silicon film 13 is deposited using the $SiH_4$ gas at a deposition rate of 3 nm/minute or more and crystallized by annealing. With these processes, the thin polysilicon film 14, 26, or 36 with a resistivity as low as that of deposition using the $Si_2H_6$ gas can be formed.

In addition, since thickness uniformity and step coverage are improved as compared to deposition using the $Si_2H_6$ gas, the thin polysilicon film can be effectively used as an electrode material for highly integrated devices with a fine structure. In this case, the resistivity of the electrode material can be lowered. Therefore, the operation rate of the highly integrated devices can be largely increased.

What is claimed is:

1. A method of forming a thin semiconductor film including an impurity for obtaining a conductivity, comprising the step of depositing a thin amorphous silicon film having a thickness of less than or equal to 100 nm by chemical vapor deposition at a deposition temperature of 530° C. to 570° C. using silane as a deposition source gas at a deposition rate of at least 3 nm/minute while introducing the impurity, and the step of crystallizing said deposited thin amorphous silicon film by annealing wherein the resistivity of the film decreases with an increase in the deposition rate.

2. A method according to claim 1, wherein the step of depositing said thin amorphous silicon film includes the step of performing deposition at a deposition pressure of 100 to 500 Pa and the deposition rate of at least 3 nm/minute.

3. A method according to claim 1, wherein the step of depositing said thin amorphous silicon film includes the step of performing deposition while setting a concentration of the impurity in said thin amorphous silicon film to $3 \times 10^{20}$ to $20 \times 10^{20}$ $cm^{-3}$.

4. A method according to claim 1, wherein, as a gas for introducing the impurity, any one of phosphine and tertiary butyl phosphine is used in deposition of said thin amorphous silicon film.

5. A method according to claim 1, wherein, as a gas for introducing the impurity, any one of arsine, arsenic trichloride, and tertiary butyl arsine is used in deposition of said thin amorphous silicon film.

6. A method according to claim 1, wherein, as a gas for doping the impurity, diborane is used in deposition of said thin amorphous silicon film.

7. A method according to claim 1, wherein the step of crystallizing said thin amorphous silicon film includes the step of performing crystallization at an annealing temperature of 580° C. to 950° C.

8. A method according to claim 1, wherein said deposition source gas includes $SiH_4$ gas.

* * * * *